(12) United States Patent
Toyoda et al.

(10) Patent No.: US 7,972,538 B2
(45) Date of Patent: Jul. 5, 2011

(54) CONDUCTIVE PATTERN FORMATION INK, CONDUCTIVE PATTERN AND WIRING SUBSTRATE

(75) Inventors: Naoyuki Toyoda, Suwa (JP); Toshiyuki Kobayashi, Chino (JP); Sachiko Endo, Tatsuno (JP)

(73) Assignee: Seiko Epson Corporation (JP)

( * ) Notice: Subject to any disclaimer, the term of this patent is extended or adjusted under 35 U.S.C. 154(b) by 123 days.

(21) Appl. No.: 12/183,152

(22) Filed: Jul. 31, 2008

(65) Prior Publication Data

US 2009/0032779 A1 Feb. 5, 2009

(30) Foreign Application Priority Data

Aug. 1, 2007 (JP) .................................. 2007-201389

(51) Int. Cl.
*H01B 1/22* (2006.01)

(52) U.S. Cl. ..... 252/512; 106/1.18; 106/1.19; 106/1.21; 252/513; 252/514; 252/500

(58) Field of Classification Search .................. 252/500, 252/512–514; 427/596; 106/1.18, 1.19, 106/1.21

See application file for complete search history.

(56) References Cited

U.S. PATENT DOCUMENTS

| | | | | |
|---|---|---|---|---|
| 4,387,383 A * | 6/1983 | Sayko | ............................. | 347/71 |
| 5,132,248 A | 7/1992 | Drummond et al. | | |
| 6,487,774 B1 | 12/2002 | Nakao et al. | | |
| 6,979,416 B2 | 12/2005 | Nakao et al. | | |
| 2002/0189402 A1 * | 12/2002 | Ito et al. | ........................... | 75/363 |
| 2004/0061747 A1 * | 4/2004 | Nakao et al. | ..................... | 347/85 |
| 2007/0190323 A1 * | 8/2007 | Lee et al. | ....................... | 428/402 |
| 2008/0187651 A1 * | 8/2008 | Lee et al. | ......................... | 427/77 |
| 2008/0230393 A1 * | 9/2008 | Okazaki et al. | ............... | 205/123 |

FOREIGN PATENT DOCUMENTS

| | | |
|---|---|---|
| JP | 2003-187640 | 7/2003 |
| JP | 2006-009120 | 1/2006 |
| JP | 2007-087735 | 4/2007 |
| JP | 2008-214591 | 9/2008 |
| WO | 99-38176 | 7/1999 |
| WO | WO 2006093398 A1 * | 9/2006 |

* cited by examiner

*Primary Examiner* — Harold Y Pyon
*Assistant Examiner* — Haidung D Nguyen
(74) *Attorney, Agent, or Firm* — Harness, Dickey & Pierce, P.L.C.

(57) ABSTRACT

A conductive pattern formation ink capable of producing a conductive pattern with reduced likelihood of generation of cracks, a conductive pattern which is small in the number of cracks generated, low in specific resistance and superior in high-frequency characteristics, and a wiring substrate provided with the conductive pattern which is small in the number of cracks generated, low in specific resistance and superior in high-frequency characteristics are provided. The conductive pattern formation ink is used for forming a conductive pattern on a base member by patterning and comprised of a dispersion solution. The dispersion solution includes a solvent, metal particles dispersed in the solvent, and an anti-cracking agent contained in the solvent, wherein the anti-cracking agent is contained for preventing generation of cracks in the conductive pattern during desolvation of the solvent.

10 Claims, 5 Drawing Sheets

CONDUCTIVE PATTERN FORMATION INK, CONDUCTIVE PATTERN AND WIRING SUBSTRATE

CROSS-REFERENCE TO RELATED APPLICATION

This application claims a priority to Japanese Patent Application No. 2007-201389 filed on Aug. 1, 2007 which is hereby expressly incorporated by reference herein in its entirety.

BACKGROUND

1. Technical Field

The present invention relates to a conductive pattern formation ink, a conductive pattern and a wiring substrate, and more specially relates to a conductive pattern formation ink, a conductive pattern formed by the conductive pattern formation ink and a wiring substrate provided with the conductive pattern.

2. Related Art

A wiring for use in an electronic circuit or an integrated circuit is produced using a photolithography method or the like.

In this photolithography method, a photosensitive material, which is called a resist, is applied on a substrate precoated with a conductive film, light is irradiated on the resist at a pattern corresponding to a wiring to be formed, the resist irradiated is developed to form a resist pattern, and the conductive film is etched using the resist pattern to obtain the wiring on the substrate.

The photolithography method requires use of bulky equipments such as a vacuum apparatus and the like and a complex process. In the photolithography method, efficiency of using a material is as low as about several percentages, which means that there is no choice but to waste the material for the most part. This leads to an increase in production costs.

Meanwhile, there has been proposed a method of forming a conductive pattern (wiring), which makes use of what is called an ink jet method, i.e., a liquid droplet ejecting method by which a liquid material is ejected in the form of liquid droplets from a liquid ejection head (see, e.g., U.S. Pat. No. 5,132,248).

With this method, a conductive pattern formation ink, in which conductive particulates are dispersed, is directly applied on a substrate according to a desired pattern, and the ink thus applied is transformed into a conductive pattern by subsequently evaporating a solvent through a heat treatment or laser irradiation. This method enjoys merits in that it requires no photolithography, bitterly simplifies a process and reduces a quantity of raw materials used.

However, a conductive pattern produced by a conventional conductive pattern formation ink suffers from a drawback in that cracks are likely to be generated in the conductive pattern during a course of evaporating the solvent, which may lead to an increase in specific resistance of the conductive pattern and may result in disconnection of the conductive pattern. In particular, generation of the cracks becomes severe as the conductive pattern grows thicker.

Causes of generating such cracks are presumed to be sudden contraction in volume of the conductive pattern during evaporation of the solvent, contraction in volume of the conductive pattern arising from breakaway of a dispersant adhering to the conductive particulates, enlargement of pores of the conductive pattern attributable to grain growth of silver particulates caused by heating during evaporation of the solvent, and so forth.

Furthermore, if the pores of the conductive pattern are enlarged due to the grain growth of the silver particulates and come up to a surface of the conductive pattern, the conductive pattern exhibits reduction in its surface planarity. This poses a problem in that what is called a skin effect is not attained, consequently reducing high-frequency characteristics of the conductive pattern.

When a relatively thick conductive pattern is formed by the ink jet method, it is sometimes a case that a conductive pattern formation ink is overlappingly applied on a substrate. In this case, a previously applied layer of ink is dried first (referred to as a preliminary drying step) and then the next layer of ink is applied in an effort to prevent disconnection or warp in shape of the conductive pattern.

In the conductive pattern formation method noted just above, it is often a case that the finished conductive pattern becomes a laminated structure because the conductive pattern formation ink applying step and the preliminary drying step are repeated alternately. With the conductive pattern of this laminated structure, interlayer specific resistance may sometimes be increased and specific resistance of the conductive pattern as a whole may become higher.

SUMMARY

It is an object of the present invention to provide a conductive pattern formation ink capable of producing a conductive pattern with reduced likelihood of generation of cracks, a conductive pattern which is small in the number of cracks generated, low in specific resistance and superior in high-frequency characteristics, and a wiring substrate provided with the conductive pattern which is small in the number of cracks generated, low in specific resistance and superior in high-frequency characteristics.

With this object in mind, a first aspect of the present invention is directed to a conductive pattern formation ink for forming a conductive pattern on a base member by patterning, the conductive pattern formation ink comprised of a dispersion solution.

The dispersion solution comprises a solvent, metal particles dispersed in the solvent, and an anti-cracking agent contained in the solvent, the anti-cracking agent being contained for preventing generation of cracks in the conductive pattern during desolvation of the solvent.

This makes it possible to provide a conductive pattern formation ink capable of producing a conductive pattern with reduced likelihood of generation of cracks.

In the conductive pattern formation ink of the present invention, it is preferred that a content of the anti-cracking agent in the dispersion solution is in the range of 5 to 25 wt %.

This makes it possible to more effectively prevent generation of cracks.

In the conductive pattern formation ink of the present invention, it is preferred that the anti-cracking agent comprises polyglycerin compound having a polyglycerin chemical structure.

This makes it possible to further effectively prevent generation of cracks.

In the conductive pattern formation ink of the present invention, it is preferred that a weight average molecular weight of the polyglycerin compound is in the range of 300 to 3000.

This makes it possible to more reliably prevent generation of cracks.

In the conductive pattern formation ink of the present invention, it is preferred that the conductive pattern formation ink is an ink which is used for forming the conductive pattern using a liquid droplet ejecting method.

This makes it possible to form the conductive pattern formation ink in a simple manner.

In the conductive pattern formation ink of the present invention, it is preferred that the base member is a sheet-like ceramic molded body made of a material containing ceramic particles and a binder.

The conductive pattern formation ink of the present invention is preferably used in the case where the conductive pattern is formed on such a ceramic molded body.

In the conductive pattern formation ink of the present invention, it is preferred that a metal constituting the metal particles is at least one kind selected from the group consisting of silver, copper, palladium, platinum and gold.

These metals are low in resistivity and are stable such that they are not oxidized by a heat treatment. Therefore, use of these metals makes it possible to form a conductive pattern that exhibits low resistance and high stability.

In the conductive pattern formation ink of the present invention, it is preferred that a content of the metal particles in the dispersion solution is in the range of 1 to 60 wt %.

This makes it possible to more effectively prevent generation of cracks.

In the conductive pattern formation ink of the present invention, it is preferred that the metal particles comprise metal colloid particles and the dispersion solution comprises a colloid solution.

This makes it possible to form a fine conductive pattern.

In the conductive pattern formation ink of the present invention, it is preferred that the colloid solution is obtained by preparing an aqueous solution of pH 6 to 10 in which a dispersant and a reducing agent are dissolved, dropping an aqueous metal salt solution into the aqueous solution, and then adjusting the pH of the aqueous solution to 6 through 11, wherein the dispersant is formed of hydroxy acid or salt thereof having three or more COOH and OH groups in a total number, the number of the COOH groups being equal to or greater than the number of the OH group(s).

This makes it possible to more reliably prevent generation of cracks.

A second aspect of the present invention is directed to a conductive pattern formed by the above conductive pattern formation ink defined.

This makes it possible to provide a conductive pattern which is small in the number of cracks generated, low in specific resistance and superior in high-frequency characteristics.

In the conductive pattern of the present invention, it is preferred that the conductive pattern is formed of the metal particles bonded together, the metal particles being bonded to one another on a surface of the conductive pattern without leaving any gap therebetween, wherein the conductive pattern has specific resistance of less than 20 μΩcm.

This makes it possible to form a conductive pattern being small in the number of cracks generated, low in specific resistance and superior in high-frequency characteristics.

In the conductive pattern of the present invention, it is preferred that the specific resistance is equal to or less than 15 μΩcm.

This makes it possible to form a conductive pattern being small in the number of cracks generated, low in specific resistance and superior in high-frequency characteristics.

A third aspect of the present invention is directed to a wiring substrate provided with the above conductive pattern.

This makes it possible to provide a wiring substrate provided with the conductive pattern which is small in the number of cracks generated, low in specific resistance and superior in high-frequency characteristics.

DESCRIPTION OF EXEMPLARY EMBODIMENTS

Figure 1:
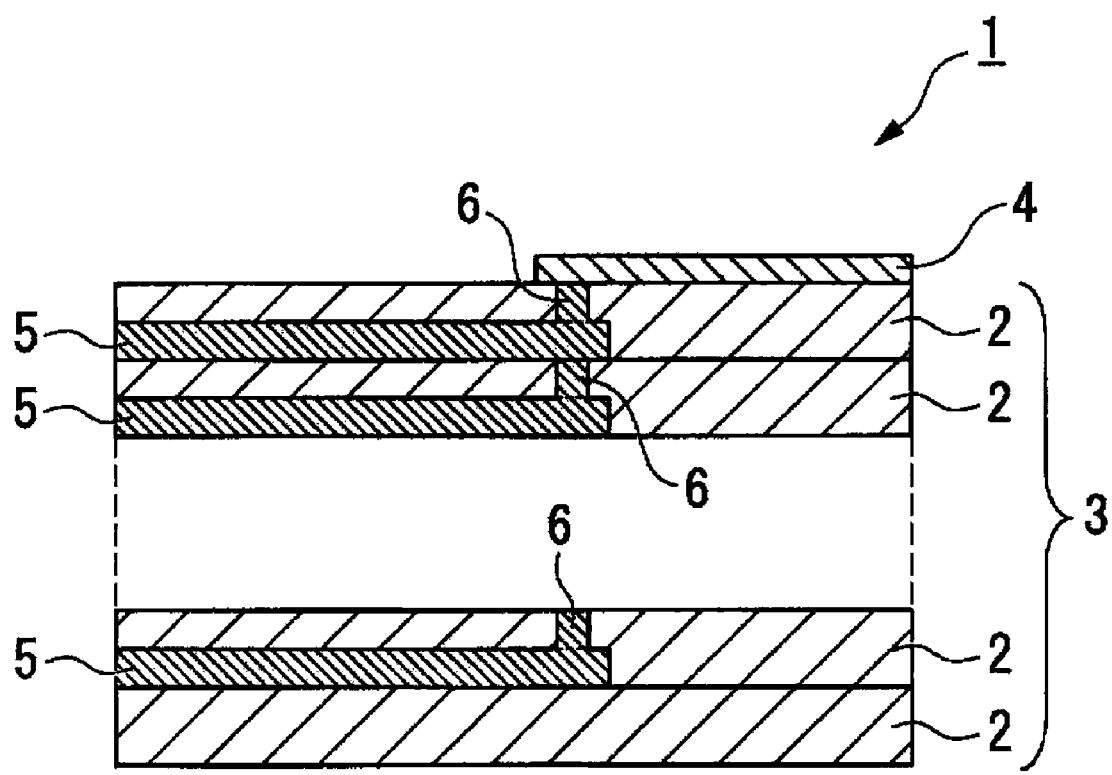
FIG. 1 is a side elevational section view showing a schematic configuration of a ceramic circuit substrate.

Embodiments of the present invention will be described in detail with reference to the accompanying drawings.

Conductive Pattern Formation Ink

First, description will be made on a preferred embodiment of a conductive pattern formation ink. In the present embodiment, description will be representatively offered regarding a case that a colloid solution including silver colloid particles dispersed therein is used as a dispersion solution in which metal particles are dispersed in a solvent.

The conductive pattern formation ink (hereinafter simply referred to as an ink) of the present embodiment is comprised of a colloid solution (dispersion solution) in which silver colloid particles are dispersed. The colloid solution further contains an anti-cracking agent which serves to prevent generation of cracks during desolvation of the solvent.

In other words, the anti-cracking agent has a function of preventing generation of cracks in a film formed by the conductive pattern formation ink when drying (desolvating) the film (namely, when drying a pre-pattern which will be transformed into a conductive pattern described later).

The ink is comprised of a colloid solution and the anti-cracking agent contained in the colloid solution. The colloid solution is obtained by preparing an aqueous solution of pH 6 to 10 in which a dispersant and a reducing agent are dissolved, dropping an aqueous silver salt solution into the aqueous solution, and then adjusting the pH of the aqueous solution to 6 through 11.

When the aqueous silver salt solution is dropped into the aqueous solution, $Ag^+$ ions derived from silver salt contained in the aqueous silver salt solution are reduced by the reducing agent contained in the aqueous solution, so that the $Ag^+$ ions are transformed into silver atoms to produce the silver particles in the aqueous solution. Therefore, in the present embodiment, the silver salt is a starting material for producing the silver particulates.

In this regard, it is to be noted that the dispersant is formed of hydroxy acid or salt thereof having three or more COOH and OH groups in a total number, wherein the number of the COOH groups is equal to or greater than the number of the OH group(s).

The ink of the present embodiment will be described hereinafter. With a view to assure increased understanding of constitution of the ink, description on a method of producing the ink will precede description regarding the constitution of the ink.

In the method of producing the ink of the present embodiment, the aqueous solution is first prepared in which the dispersant and the reducing agent are dissolved.

As described above, the dispersant is formed of the hydroxy acid or salt thereof having three or more COOH and OH groups in the total number, wherein the number of the COOH groups is equal to or greater than the number of the OH group(s). The dispersant is adsorbed to surfaces of the silver fine particulates produced in the aqueous solution to form silver colloid particles.

The dispersant acts to stabilize the colloid solution by allowing the silver colloid particles to be uniformly dispersed in the aqueous solution under electric repulsion forces of the COOH groups present in the dispersant.

If the total number of the COOH and OH groups contained in the dispersant is less than three, or if the number of the COOH groups is smaller than the number of the OH groups, the silver colloid particles exhibit reduced dispersibility, which is undesirable in the present embodiment.

Examples of the dispersant include trisodium citrate, tripotassium citrate, trilithium citrate, triammonium citrate, disodium malate, tannic acid, Gallo tannic acid, Gallo tannin and so forth.

The dispersant is blended preferably in such a blending quantity that a mole ratio of the dispersant to silver contained in the silver salt becomes equal to about 1:1 to 1:100. Examples of the silver salt, which is the starting material of the silver particulates, include silver nitrate and the like.

If the mole ratio of the dispersant to the silver salt becomes greater, a particle size of the silver particles grows smaller and contact points between the silver particles are increased. This makes it possible to obtain a film whose volume resistance value is low.

As described above, the reducing agent acts to generate the silver particles through a reduction of $Ag^+$ ions contained in the silver salt (starting material) such as the silver nitrate ($Ag^+NO^{3-}$) or the like.

The reducing agent is not particularly limited to a specific type. Examples of the reducing agent include: an amine-based reducing agent such as dimethylaminoethanol, methyldiethanolamine or triethanolamine; a hydrogen compound-based reducing agent such as sodium boron hydroxide, a hydrogen gas or hydrogen iodide; an oxide-based reducing agent such as carbon monoxide or sulfurous acid; a low-valent metal salt-based reducing agent such as Fe (II) compound or Sn (II) compound; an organic compound-based reducing agent such as sugar (e.g., D-glucose) or formaldehyde; hydroxy acid salt, cited above as the dispersant, such as trisodium citrate, tripotassium citrate, trilithium citrate, triammonium citrate, disodium malate or tannic acid; and the like.

Among them, the tannic acid and the hydroxy acid salt serve as both the reducing agent and the dispersant. These reducing agents and dispersants may be used independently or in combination. When using these compounds, it may be possible to accelerate a reducing reaction by applying light or heat thereto.

The reducing agent is blended in such a blending quantity as to completely reduce the silver salt which is the starting material of the silver particles. If the blending quantity is excessive, the reducing agent remains in the colloid solution (aqueous silver colloid solution) as impurities, which may be a cause of adversely affecting conductivity after formation of a film.

This means that the blending quantity should preferably be a smallest possible quantity. More specifically, the blending quantity is such that a mole ration of the silver salt to the reducing agent becomes equal to about 1:1 to 1:3.

In the ink of the present embodiment, it is preferred that, after the aqueous solution is prepared by dissolving the dispersant and the reducing agent in the solvent, pH of the aqueous solution is adjusted to 6 to 10.

The reason is as follows. For example, in the case of mixing the trisodium citrate as the dispersant and ferrous sulfate as the reducing agent, the pH of the aqueous solution becomes equal to about 4 to 5 depending on an overall concentration thereof, which falls below the pH 6 mentioned above.

At this time, equilibrium of a reaction represented by the following reaction equation (1) is shifted to the right side by hydrogen ions existing in the aqueous solution, thereby increasing a quantity of the COOH groups.

$$—COO^- + H^+ \rightarrow —COOH \qquad (1)$$

This reduces electric repulsion forces of the surfaces of the silver particles obtained by subsequently dropping the aqueous silver salt solution, which leads to reduction in dispersibility of the silver particles (colloid particles).

For this reason, after the aqueous solution has been prepared by dissolving the dispersant and the reducing agent in the solvent, an alkaline compound is added to the aqueous solution to reduce a hydrogen ion concentration thereof.

The alkaline compound added at this time is not particularly limited to a specific type. Examples of the alkaline compound include sodium hydroxide, potassium hydroxide, lithium hydroxide, ammonia water and the like. Among them, it is preferable to use the sodium hydroxide that can easily adjust the pH with a small amount.

Meanwhile, addition of the alkaline compound in a quantity great enough to increase the pH of the aqueous solution to more than 10 is undesirable, because the hydroxide of ions of a residual reducing agent (that is, residue of the reducing agent) such as iron ions or the like is apt to precipitate.

Next, in the method of producing the ink of the present embodiment, the aqueous silver salt solution containing the silver salt is dropped into the aqueous solution in which the dispersant and the reducing agent are dissolved.

The silver salt is not particularly limited to a specific type. Examples of the silver salt include silver acetate, silver carbonate, silver oxide, silver sulfate, silver nitrite, silver chlorate, silver sulfide, silver chromate, silver nitrate, silver dichromate and the like. Among them, it is preferable to use the silver nitrate that exhibits high water-solubility.

A quantity of the silver salt is decided by taking into account a target content of the silver colloid particles and a percentage of the silver salt reduced by the reducing agent. In the case of the silver nitrate, about 15 to 70 mass parts of the silver nitrate is used on the basis of 100 mass parts of the aqueous silver salt solution.

The aqueous silver salt solution is prepared by dissolving the silver salt in pure water and is gradually dropped into the aqueous solution in which the dispersant and the reducing agent are dissolved.

As described above, in this step, the $Ag^+$ ions contained in the silver salt is reduced by the reducing agent so that the $Ag^+$ ions are transformed into silver atoms to produce the silver particles in the aqueous solution. At this time, the dispersant is adsorbed to the surfaces of the silver particles to form silver colloid particles.

This produces an aqueous solution (aqueous dispersion solution) in which the silver colloid particles are dispersed in a colloidal form, that is, the colloid solution.

In addition to the silver colloid particles, the residual reducing agent and the dispersant are likely to exist in the colloid solution thus obtained. Thus, an ion concentration of the colloid solution as a whole becomes high.

In the colloid solution of this state, the silver particles are aggregated to produce aggregates and the aggregates are easily precipitated. For this reason, it is preferred that cleaning is performed to remove superfluous ions present in the colloid solution and to reduce the ion concentration thereof.

Cleaning methods include: a method of repeating several times the steps of leaving the colloid solution containing the silver colloid particles at rest for a specified time, removing supernatant liquid thus created, adding pure water to the colloid solution, stirring the colloid solution, leaving the colloid solution at rest for a specified time and removing supernatant liquid thus created; a method of performing centrifugal separation in place of leaving the colloid solution at rest; a method of removing ions by ultrafiltration; and the like.

In the method of producing the ink of the present embodiment, it is preferred that, at the end of the above step, the pH of the colloid solution is finally adjusted to 6 through 11 by adding, if necessary, an aqueous alkali metal hydroxide solution to the colloid solution.

Due to the cleaning performed after reduction, a concentration of sodium ions as electrolytic ions is sometimes decreased. With the colloid solution of this state, equilibrium of a reaction represented by the following reaction equation (2) is shifted to the right side.

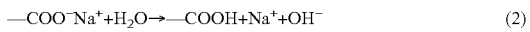  (2)

In this case, the silver colloid particles exhibits a decrease in its electric repulsion force and they (that is, the silver particles) suffer from reduction in its dispersibility. For this reason, the equilibrium of the reaction equation (2) is shifted to the left side and the silver colloid particles is stabilized by adding an appropriate amount of alkali metal hydroxide.

The alkali metal hydroxide used at this time includes, e.g., the same compound as used in first adjusting the pH of the above aqueous solution. If the pH is smaller than 6, the equilibrium of the reaction equation (2) is shifted to the right side, consequently making the silver colloid particles unstable.

In contrast, if the pH is greater than 11, precipitation of hydroxide salt of residual ions such as iron ions is apt to occur, which is undesirable. In the case where the iron ions or the like are removed in advance, no big problem is posed even when the pH is greater than 11.

It is preferred that positive ions such as sodium ions are added in the form of hydroxide. This makes it possible to use self-protolysis of water. Therefore, this is the most effective way of adding the positive ions such as sodium ions to the colloid solution.

Next, as described above, the anti-cracking agent is added to the colloid solution thus obtained.

The anti-cracking agent can bind the silver colloid particles together and prevent them from being scattered, even if a base member (particularly, a ceramic green sheet which will be forth below) is expanded and contracted by a temperature change, the pre-pattern of the conductive pattern is shrunk during desolvation of the solvent, or the like. As a result, it becomes possible to prevent generation of cracks in the conductive pattern formed.

Examples of the anti-cracking agent include a polyglycerin compound having a polyglycerin chemical structure such as polyglycerin, polyglycerin ester, polyethylene glycol, and the like, one or more of which may be used independently or in combination.

Examples of the polyglycerin ester include monostearate, tristearate, tetrastearate, monooleate, pentaoleate, monolaurate, monocaprylate, polycyanurate, sesquistearate, decaoleate and sesquioleate of polyglycerin, and the like.

Use of such an anti-cracking agent ensures that polymer chains exist between the silver colloid particles. This makes it possible to maintain an adequate distance between the silver colloid particles and to prevent them from aggregating together, whereby the silver colloid particles can be stably dispersed at a high concentration in the colloid solution.

In addition, the colloid solution which contains the anti-cracking agent has a suitable viscosity and therefore exhibits increased film-forming capability.

Furthermore, the anti-cracking agent has a relatively high boiling point. In the process of forming the conductive pattern with the conductive pattern formation ink, the anti-cracking agent is evaporated or oxidatively decomposed after the dispersion medium (solvent) contained in the colloid solution has been evaporated.

Therefore, the anti-cracking agent continues to exist around the silver colloid particles, thereby avoiding any rapid volumetric shrinkage of the pre-pattern of the conductive pattern and any grain growth of the silver particles.

Among the compounds stated above, it is preferable to use the polyglycerin compound with the polyglycerin chemical structure, and more preferable to use polyglycerin. This makes it possible to more reliably prevent generation of cracks and also to make more prominent the effects mentioned above. The polyglycerin compound is also preferred because it exhibits increased solvent (water) solubility.

A weight average molecular weight of the polyglycerin compound used herein is preferably in the range of 300 to 3000, and more preferably in the range of 400 to 600. This makes it possible to more reliably prevent generation of cracks when drying a film formed of the conductive pattern formation ink.

If the weight average molecular weight of the polyglycerin compound falls below the lower limit value noted above, the compound tends to be decomposed during a course of drying, which in turn reduces the effect of preventing generation of cracks.

If the weight average molecular weight of the polyglycerin compound exceeds the upper limit value noted above, dispersibility of the silver colloid particles in the colloid solution is reduced by an excluded volume effect of the polyglycerin compound or the like.

Examples of the polyethylene glycol include polyethylene glycol #200 (having a weight average molecular weight of 200), polyethylene glycol #300 (having a weight average molecular weight of 300), polyethylene glycol #400 (having a weight average molecular weight of 400), polyethylene glycol #600 (having a weight average molecular weight of 600), polyethylene glycol #1000 (having a weight average molecular weight of 1000), polyethylene glycol #1500 (having a weight average molecular weight of 1500), polyethylene glycol #1540 (having a weight average molecular weight of 1540), polyethylene glycol #2000 (having a weight average molecular weight of 2000), and the like.

A content of the anti-cracking agent (particularly, the polyglycerin compound) in the ink (colloid solution) is preferably in the range of 5 to 25 wt %, more preferably in the range of 5 to 22 wt %, and even more preferably in the range of 7 to 20 wt %. This makes it possible to more effectively prevent generation of cracks.

If the content of the anti-cracking agent is smaller than the lower limit value noted above, the effect of preventing generation of cracks is reduced in the case where the weight average molecular weight falls below the lower limit value.

If the content of the anti-cracking agent is greater than the upper limit value noted above, dispersibility of the silver colloid particles in the colloid solution (ink) is reduced in the case where the weight average molecular weight exceeds the upper limit value.

During the process of preparing the ink, the anti-cracking agent may be added at any time after formation of the silver colloid particles. For example, an aqueous solution containing the anti-cracking agent of a predetermined concentration may be used in place of the pure water added in the cleaning step after the reduction reaction.

Next, description will be made on constitution of the ink of the present embodiment. As described above, the ink of the present embodiment is comprised of the colloid solution that contains at least the silver colloid particles including the silver particles. In addition, the colloid solution contains the anti-cracking agent.

The colloid solution refers to an aqueous solution in which the silver particles adsorbing the dispersant on the surfaces thereof are stably dispersed. A content of the silver colloid particles including the silver particles in the ink (colloid solution) is in the range of about 1 to 60 wt %. As described above, a non-ionic compound such as the polyglycerin compound or the polyethylene glycol is contained in the colloid solution.

As set forth above, the ink of the present embodiment is prepared by dropping the aqueous silver salt solution into the aqueous solution of pH 6 to 10 in which the dispersant and the reducing agent are dissolved, adjusting the pH of the aqueous solution to 6 through 11, and then adding the anti-cracking agent thereto.

The silver colloid particles include the silver particles adsorbing the dispersant on at least surfaces thereof. Empirically, the silver colloid particles correspond to solid contents left when water is mostly removed from the colloid solution by use of silica gel and when the colloid solution is dried thereafter at a temperature of 70° C. or less.

Typically, the solid contents contain the silver particles and the dispersant. In addition, there is also a case that the solid contents contain the residual reducing agent or the like.

A content (concentration) of the silver colloid particles is preferably in the range of about 1 to 60 wt %, and more preferably in the range of about 10 to 45 wt %. If the content of the silver colloid particles falls below the lower limit value noted above, an absolute content of the silver contained in the ink becomes too small. As a result, there is a need to apply the ink several times when the conductive pattern is formed into a relatively thick film.

In contrast, if the content of the silver colloid particles exceeds the upper limit value noted above, the content of the silver particles contained in the ink becomes too great unnecessarily, thus reducing dispersibility of the silver particles. In order to avoid the dispersibility reduction, it is necessary to increase frequency of stirring the ink.

An average particle size of the silver colloid particles is preferably in the range of 1 to 100 nm, and more preferably in the range of 10 to 30 nm.

When the silver colloid particles (that is, solid contents containing no anti-cracking agent) is heated up to 500° C. in a thermogravimetric analysis, a heat loss of the silver colloid particles is preferably in the range of about 1 to 25 wt %.

As the silver colloid particles (solid contents) is heated up to 500° C., the dispersant and the residual reducing agent are oxidatively decomposed and are gasified and eliminated for their most parts.

Since a quantity of the residual reducing agent seems to be insignificant, it may be conceived that the loss of the silver colloid particles when heated up to 500° C. corresponds substantially to a quantity of the dispersant present in the silver colloid particles.

If the loss-on-heating is smaller than 1 wt %, the quantity of the dispersant relative to that of the silver particles becomes too small, thus reducing dispersibility of the silver particles (silver colloid particles). In contrast, if the loss-on-heating is greater than 25 wt %, the quantity of the residual dispersant relative to that of the silver particles becomes too great, consequently increasing specific resistance of the conductive pattern.

The specific resistance can be improved to a certain degree by heating and sintering the conductive pattern after formation thereof to decompose and eliminate organic components. However, this is undesirable because cracks are apt to be generated in the conductive pattern if the heating and sintering temperature is too high.

Although the silver colloid particles including the silver particles are dispersed in the colloid solution according to the description made above, the colloid particles may include other metal particles than the silver particles. Examples of a metal constituting the other metal particles include palladium, platinum, gold, alloy thereof, and the like, and one or more of which may be used independently or in combination.

In the case of using metal particles composed of the alloy, the alloy may contain the above mentioned metal as its major component, and other metals. Further, it may also be possible to use alloy obtained by mixing the above mentioned metals with each other in an arbitrary ratio. Mixed particles (e.g., combination of silver particles, copper particles and palladium particles mixed in an arbitrary ratio) may be dispersed in the colloid solution.

The above mentioned metals are low in resistivity and are stable such that they are not oxidized by a heat treatment. Therefore, use of these metals makes it possible to form a conductive pattern that exhibits low resistance and high stability.

Conductive Pattern

Next, description will be given on the conductive pattern of the present embodiment. The conductive pattern is a thin-film type conductive pattern formed by applying the ink on a base member and heating the same so that the silver particles can be bonded together.

At least on a surface of the conductive pattern, the silver particles are bonded to one another without leaving any gap therebetween. The conductive pattern has specific resistance of less than 20 μΩcm.

The conductive pattern of the present embodiment is formed by applying the ink on the base member to obtain the pre-pattern, drying (or desolvating) the pre-pattern (ink), and then sintering the same. The drying step is performed preferably at the range of 40 to 100° C., and more preferably at the range of 50 to 70° C.

This makes it possible to more effectively prevent generation of cracks when the pre-pattern (ink) has been dried. The sintering step is preferably performed by heating the ink at 160° C. or more for 20 minutes or more.

In the case where the base member on which the ink is applied is a ceramic molded body (namely, a ceramic green sheet) which will be described below, the sintering step can be carried out simultaneously with sintering the ceramic molded body.

The base member is not particularly limited to a specific type, examples of the base member include an alumina sintered body, a substrate made of polyimide resin, phenol resin, glass epoxy resin, glass or the like, and a sheet-like ceramic molded body made of a material including ceramic and a binder.

A method of applying the ink on the base member is not limited to a specific method, examples of the method include a liquid droplet ejecting method, a screen printing method, a bar coating method, a spin coating method, a brush-used method and the like.

In the case of using the liquid droplet ejecting method (particularly, an ink jet method) among the above-noted methods, it is possible to form a fine and complex conductive pattern in a simple and easy manner.

The conductive pattern of the present embodiment is formed using the ink to which the afore-mentioned anti-cracking agent is added. Since the anti-cracking agent has a relatively high boiling point, it is evaporated or thermally decomposed after evaporation of the dispersion medium of the colloid solution in the process of forming the conductive pattern from the ink.

Therefore, the anti-cracking agent continues to exist around the silver colloid particles, thereby avoiding any rapid volumetric shrinkage of the pre-pattern and any grain growth of the silver particles. Inasmuch as the grain growth of the silver particles is prevented in the process of forming the conductive pattern, the silver particles in the conductive pattern are kept in a closely bonded state.

In particular, the silver particles on the surface of the conductive pattern are bonded to one another without leaving any gap therebetween. This reduces generation of irregularities on the surface of the conductive pattern and enhances the planarity thereof. Thus, there appears a so-called skin effect, which assists in improving high-frequency characteristics of the conductive pattern.

Due to the fact that the silver particles are kept in a closely bonded state, possibility of generation of cracks in the conductive pattern is reduced. This also prevents occurrence of wiring disconnection and assists in decreasing specific resistance.

The specific resistance of the conductive pattern is preferably smaller than 20 μΩcm, and more preferably 15 μΩcm or less. The term "specific resistance" used herein refers to specific resistance available when the ink is applied, heated at 160° C. and dried.

If the specific resistance is equal to or greater than 20 μΩcm, it is difficult to use the conductive pattern in a conductivity-requiring application, e.g., in an electrode formed on a circuit substrate.

When forming the conductive pattern of the present embodiment, it is possible to provide a thick conductive pattern by repeatedly performing the steps of applying the ink by the afore-mentioned applying method, preliminarily heating the ink to evaporate the dispersion medium such as water or the like, and applying once again the ink on the preliminarily heated film.

The anti-cracking agent and the silver colloid particles are left in the ink from which the dispersion medium such as water or the like has been evaporated. Since the anti-cracking agent has a relatively high viscosity, there is no possibility that the film thus formed by the ink may be washed away even when it is not fully dried. Therefore, it becomes possible to apply the ink once again after the ink is first applied, dried and left at rest for a long period of time.

Furthermore, since the anti-cracking agent has a relatively high boiling point, there is also no possibility that the ink may undergo a change in quality even when the ink is applied, dried and left at rest for a long period of time. It also becomes possible to apply the ink once again, which makes it possible to form the film with a uniform quality.

This eliminates possibility that the conductive pattern may become a multi-layer structure, which would lead to an increase in inter-layer specific resistance and, eventually, an increase in specific resistance of the conductive pattern as a whole.

By going through the above-noted steps, the conductive pattern of the present embodiment can be formed thicker than a conductive pattern produced by a conventional ink. More specifically, it is possible to form a conductive pattern whose thickness is equal to or greater than 5 μm.

Since the conductive pattern of the present embodiment is formed by the afore-mentioned ink, cracks are seldom generated even when the conductive pattern is formed into a thickness of 5 μm or more. This makes it possible to construct a conductive pattern with reduced specific resistance.

There is no need to particularly restrict an upper limit of the thickness of the conductive pattern. However, if the thickness of the conductive pattern is too great, difficulties may be encountered in removing the dispersion medium and the anti-cracking agent, which may possibly increase the specific resistance of the conductive pattern. For this reason, it is preferred that the conductive pattern has a thickness of about 100 μm or less.

The conductive pattern of the present embodiment exhibits good adhesion with respect to the base member (substrate) set forth above.

In this regard, it is to be noted that the conductive pattern described above can find its application in high-frequency modules, interposers, micro-electromechanical systems, acceleration sensors, acoustic surface wave devices, antennas, odd-shaped electrodes (including comb electrodes) of mobile communication equipments such as a cellular phone, a PDA or the like, and electronic components of various kinds of measuring instruments.

Next, description will be made on one example of a wiring substrate (ceramic circuit substrate) having the conductive pattern formed by the conductive pattern formation ink of the present invention and one example of a method for producing the wiring substrate.

The wiring substrate of the present invention constitutes an electronic component used in various kinds of electronic equipments. The wiring substrate is produced by forming a circuit pattern, which consists of various kinds of wirings, electrodes and the like, a laminated ceramic condenser, a laminated inductor, an LC filter and a composite high-frequency component on a substrate.

More specifically, as shown in FIG. 1, the ceramic circuit substrate (wiring substrate) 1 of the present invention includes a laminated substrate 3, which is formed by laminating a plurality of (e.g., about ten through twenty) ceramic substrates 2, and a circuit 4 formed on one outermost layer, i.e., one end surface, of the laminated substrate 3, the circuit 4 being made of fine wirings and the like.

The laminated substrate 3 includes a plurality of circuits (conductive patterns) 5 formed by the conductive pattern formation ink (hereinafter simply referred to as an ink) of the present invention and arranged between the ceramic substrates 2.

Contacts (vias) 6 that make contact with circuits 5 are formed in the circuits 5. With this configuration, the circuits 5 arranged one above another are conducted through the contacts 6. Just like the circuits 5, the circuit 4 is formed by the conductive pattern formation ink of the present invention.

A method for producing the ceramic circuit substrate 1 configured as above will be described with reference to the schematic process view illustrated in FIG. 2.

Prepared first as raw powder are ceramic powder composed of alumina ($Al_2O_3$) and titanium oxide ($TiO_2$) each having an average particle size of about 1 to 2 μm and glass powder composed of boron silicate glass having an average particle size of about 1 to 2 μm.

The ceramic powder and the glass powder are mixed with each other in an appropriate mixing ratio, e.g., in a weight ratio of 1:1 to obtain a mixed powder.

Next, slurry is obtained by adding a suitable binder, a plasticizer, an organic solvent (dispersant) and the like to the mixed powder, and then mixing and stirring the same. In this regard, it is to be noted that polyvinyl butyral is preferably used as the binder.

The polyvinyl butyral is water-insoluble and is apt to be dissolved or swollen in what is called an oil-based organic solvent. This means that there is a need to use a water-based dispersion medium but not an oil-based dispersion medium as the dispersion medium of the ink.

Then, the slurry thus obtained is coated on a PET film in a sheet shape using a doctor blade, a reverse coater or the like. Depending on production conditions of an article, the slurry is formed into a sheet having a thickness of several micrometers to several hundred micrometers, and then the sheet is wound into a roll.

Subsequently, the roll is severed in conformity with use of the article and is cut into a sheet having a specified size. In the present embodiment, the roll is cut into, e.g., a square sheet whose one side has a length of 200 mm to obtain a sheet-like ceramic molded body (that is, a ceramic green sheet) 7.

If necessary, through-holes are formed in given positions by punching the ceramic green sheet 7 with a $CO_2$ laser, a YAG laser, a mechanical punch or the like. Conductive patterns are formed in the given positions of the ceramic green sheet 7 having the through-holes by screen printing a thick-film conductive paste, thereby creating contacts (not shown).

After the contacts are formed in the ceramic green sheet 7 in the afore-mentioned manner, a pre-pattern which will be transformed into the circuits 5 (corresponding to the conductive pattern of the present invention) is formed on one surface of the ceramic green sheet 7 in such a state that the pre-pattern continuously extends from the contacts.

Figure 3A:
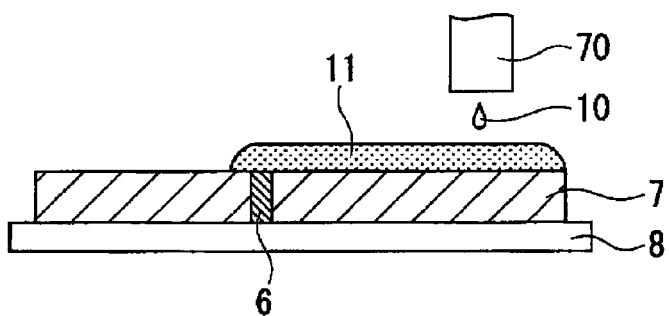
FIGS. 3A and 3B are views for explaining a production process of the ceramic circuit substrate shown in FIG. 1.

In other words, as illustrated in FIG. 3A, the conductive pattern formation ink 10 (hereinafter simply referred to as an ink 10) described above is delivered on the ceramic green sheet 7, thereby forming the pre-pattern 11.

Delivery (application) of the ink 10 on the ceramic green sheet 7 is performed using the above-mentioned ink jet method, one of the liquid droplet ejecting methods. The ink jet method refers to, e.g., a method by which, using an ink jet apparatus (liquid droplet ejecting apparatus) 50 shown in FIG. 4, the ink is ejected from an ink jet head (liquid ejecting head) 70 shown in FIG. 5.

Hereinafter, the ink jet apparatus 50 and the ink jet head 70 will be described in detail.

Figure 4:
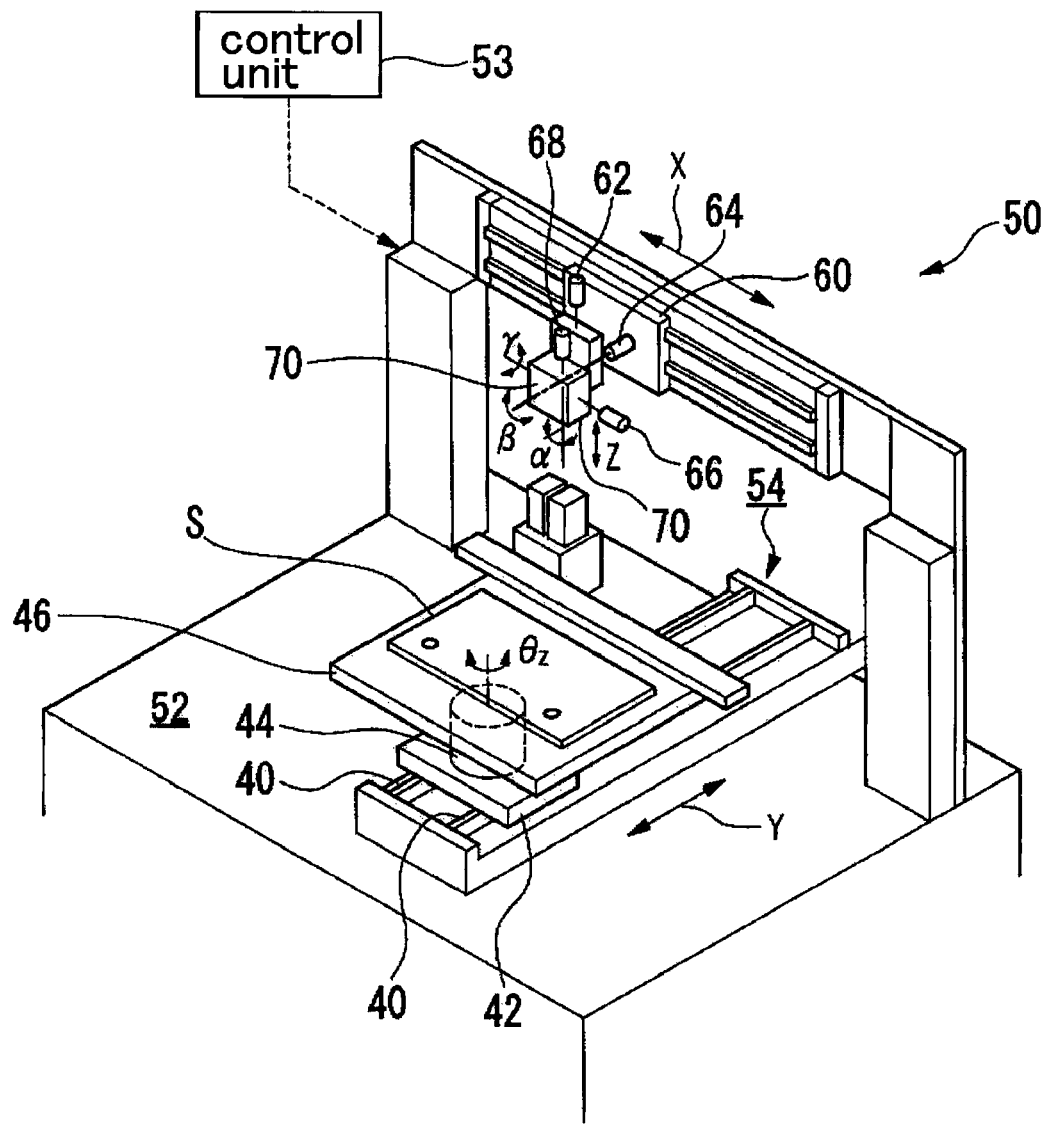
FIG. 4 is a perspective view showing a schematic configuration of an ink jet apparatus.

FIG. 4 is a perspective view showing the ink jet apparatus 50. Referring to FIG. 4, the left-and-right direction of a base 52 is designated by a X direction, the back-and-forth direction is designated by a Y direction, and the vertical direction is designated by a Z direction.

The ink jet apparatus 50 is mainly comprised of the ink jet head 70 (hereinafter simply referred to as a head 70) and a table 46 for supporting a substrate S (the ceramic green sheet 7 in the present embodiment). An operation of the ink jet apparatus 50 is controlled by means of a control unit 53.

The table 46 for supporting the substrate S can be moved and positioned in the Y direction by means of a first moving means 54 and can be swung and positioned in a θz direction by means of a motor 44.

On the other hand, the head 70 can be moved and positioned in the X direction by means of a second moving means (not shown) and can be moved and positioned in the Z direction by means of a linear motor 62. Furthermore, the head 70 can be swung and positioned in α, β and γ directions by means of motors 64, 66 and 68, respectively.

Based on this configuration, the ink jet apparatus 50 is capable of accurately controlling a relative position and posture between an ink ejecting surface 70P of the head 70 and the substrate S placed on the table 46.

A rubber heater (not shown) is arranged on a rear surface of the table 46. An upper whole surface of the ceramic green sheet 7 placed on the table 46 is heated up to a specified temperature by means of the rubber heater.

The solvent or the dispersion medium is partially evaporated from a surface side of the ink 10 shot against the ceramic green sheet 7. At this time, evaporation of the solvent or the dispersion medium is accelerated because the ceramic green sheet 7 remains in a heated state.

The ink 10 shot against the ceramic green sheet 7 is thickened first in a peripheral edge of the surface thereof. That is to say, the peripheral edge of the surface of the ink 10 begins to be thickened because a content (concentration) of solid contents (silver colloid particles) in the peripheral portion becomes higher than in the central portion more rapidly.

The peripheral edge portion of the ink 10 thus thickened stops its spreading action along a plane direction of the ceramic green sheet 7. This makes it easy to control a shot diameter and hence a line width. A heating temperature of the ceramic green sheet 7 is set equal to the drying conditions mentioned earlier.

Figure 5:
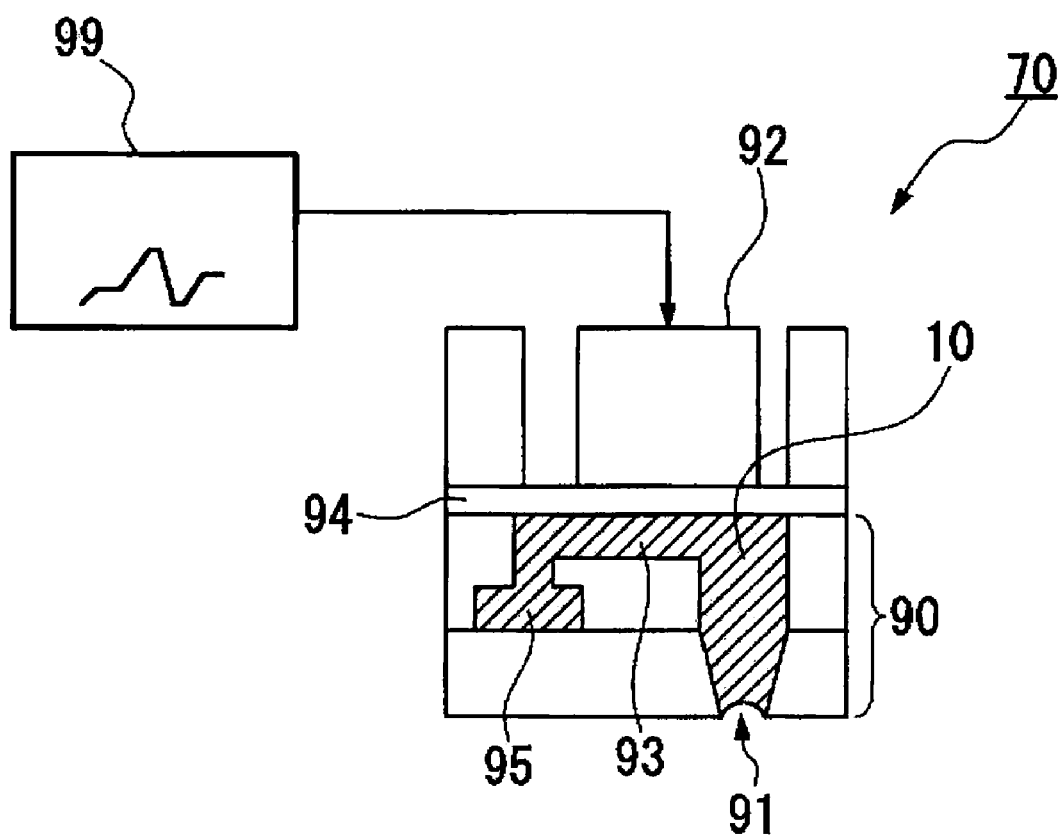
FIG. 5 is a pattern diagram for explaining a schematic configuration of an ink jet head.

As can be seen in the side elevational section view shown in FIG. 5, the head 70 is designed to eject the ink 10 from a nozzle 91 according to an ink jet system (liquid droplet ejecting system).

The liquid droplet ejecting system may be any technique known in the art, including a piezo system in which the ink is ejected using a piezo element made of a piezoelectric body and a bubble system in which the ink is ejected using the bubbles generated when heating the ink.

Among them, the piezo system is advantageous in that it does not heat the ink and therefore does not affect a composition of materials used. For this reason, the head 70 shown in FIG. 5 employs the piezo system.

The head 70 includes a head main body 90 having a reservoir 95 formed therein and a plurality of ink chambers 93 branched from the reservoir 95. The reservoir 95 serves as a flow path through which the ink 10 is supplied to the respective ink chambers 93.

A nozzle plate (not shown) that constitutes an ink ejecting surface is mounted to a lower end surface of the head main body 90. A plurality of nozzles 91 for ejecting the ink 10 are provided in the nozzle plate in a corresponding relationship with the respective ink chambers 93. Ink flow paths are formed to extend from the respective ink chambers 93 toward the corresponding nozzles 91.

On the other hand, a vibration plate 94 is mounted to an upper end surface of the head main body 90. The vibration plate 94 constitutes wall surfaces of the respective ink chambers 93. Piezo elements 92 are provided outside the vibration plate 94 in a corresponding relationship with the respective ink chambers 93.

The piezo elements 92 are formed of a piezoelectric material such as quartz or the like and a pair of electrodes (not shown) for holding the piezoelectric material therebetween. The electrodes are connected to a driving circuit 99.

If an electric signal is inputted to the piezo elements 92 from the driving circuit 99, the piezo elements 92 undergo dilation deformation or shrinkage deformation. As the piezo elements 92 undergo shrinkage deformation, pressure of the ink chambers 93 is decreased and the ink 10 is admitted into the ink chambers 93 from the reservoir 95.

As the piezo elements 92 undergo dilation deformation, the pressure of the ink chambers 93 is increased and the ink 10 is ejected from the nozzles 91. A deformation amount of the piezo elements 92 can be controlled by changing a voltage applied thereto.

Furthermore, a deformation speed of the piezo elements 92 can be controlled by changing a frequency of the voltage applied thereto. In other words, ejection conditions of the ink 10 can be controlled by adjusting conditions of the voltage applied to the piezo elements 92.

Accordingly, use of the ink jet apparatus 50 having the head 70 stated above makes it possible to accurately eject and deliver the ink 10 to a desired place in a desired quantity. Therefore, it is possible to accurately and easily form the pre-pattern 11 as shown in FIG. 3A.

By using a water-based dispersion medium as mentioned earlier, the ink 10 is prepared to ensure that a static contact angle with respect to the ceramic green sheet 7 is in the range of 30 to 90 degrees.

This eliminates possibility that the ink 10 is too broadly spread on the ceramic green sheet 7. Also eliminated is possibility that the ink 10 is strongly repulsed on the ceramic green sheet 7. Therefore, the ink 10 can be satisfactorily applied on the ceramic green sheet 7 in a desired pattern.

Once the pre-pattern 11 is formed in the above manner, the same steps are repeated to prepare a required number of, e.g., about ten to twenty, ceramic green sheets 7 each having the pre-pattern 11.

Figure 2:
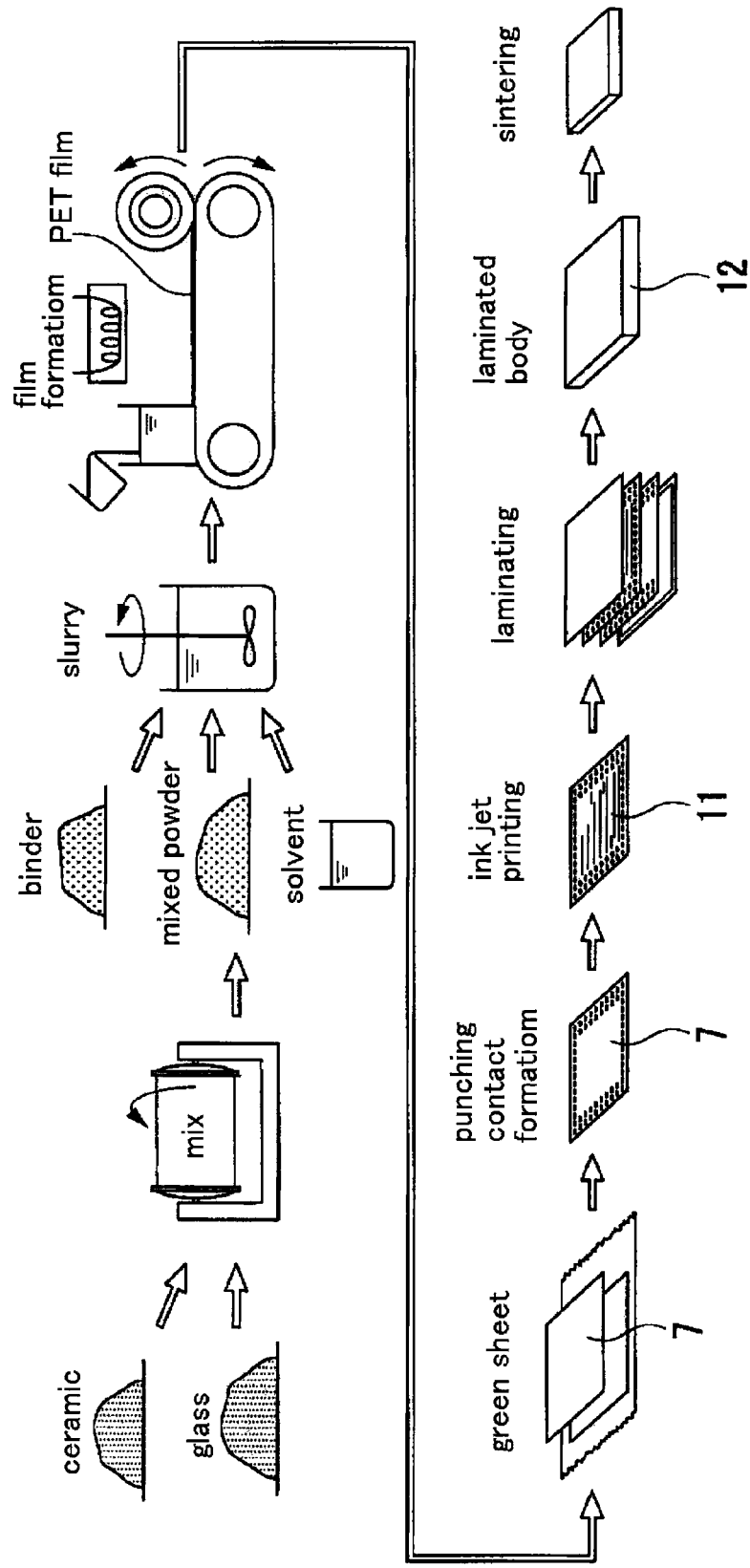
FIG. 2 is an explanatory view schematically illustrating the steps of a method for producing a ceramic circuit substrate.

Then, the PET film is peeled off from the ceramic green sheets 7 and a laminated body 12 is obtained by laminating the ceramic green sheets 7 as illustrated in FIG. 2. At this time, the ceramic green sheets 7 are arranged so that, if necessary, the pre-patterns 11 of the ceramic green sheets 7 laminated one above another can be connected through the contacts 6.

Figure 3B:
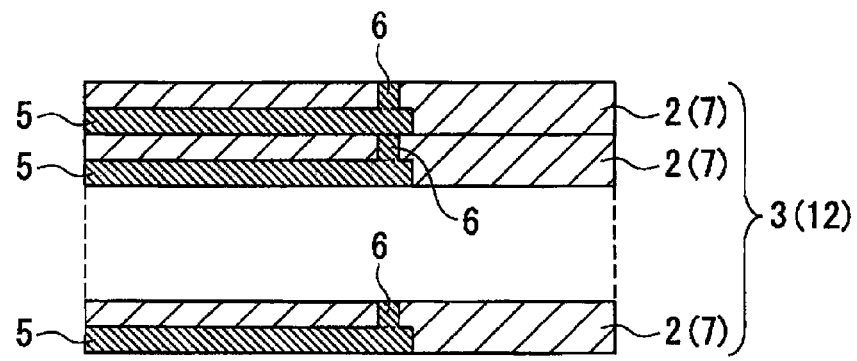

The laminated body 12 thus formed is heated by use of, e.g., a belt type furnace. As a result, the ceramic substrate 2 (wiring substrate of the present invention) is obtained by firing the respective ceramic green sheets 7 as shown in FIG. 3B.

As the silver colloid particles forming the pre-patterns 11, including the silver particles (metal particles), are sintered, the pre-patterns 11 are transformed into the circuits (conductive patterns) 5 consisting of a wiring pattern or an electrode pattern.

As the laminated body 12 is subjected to the heat treatment as mentioned above, the laminated body 12 is transformed into the laminated substrate 3 shown in FIG. 1.

In this regard, A heating temperature of the laminated body 12 is preferably equal to or more than a softening point of the glass powder contained in the ceramic green sheets 7. More specifically, it is preferred that the heating temperature is in the range of 600 to 900° C.

Heating conditions are selected to make sure that the temperature is elevated and dropped at a suitable speed. Furthermore, the laminated body 12 is maintained for a suitable period of time at a maximum heating temperature, i.e., at the temperature of 600 to 900° C.

A glass component (glass powder) of the ceramic substrates 2 thus obtained can be softened by elevating the heating temperature up to a temperature above the softening point of the glass powder, i.e., the temperature range noted above.

Therefore, if the laminated body 12 is subsequently cooled down to a normal temperature so that the glass component can be hardened, the respective ceramic substrates 2 that constitute the laminated substrate 3 are firmly bonded to the circuit (conductive pattern) 5.

The ceramic substrates 2 obtained by heating the laminated body 12 up to the temperature range noted above become what is called low temperature co-fired ceramic (LTCC) which means the ceramic fired at a temperature of 900° C. or less.

This makes it possible that metals having a relatively low melting temperature such as copper, palladium, platinum and gold, as well as the above-mentioned silver, are used as a constituent material of the circuits (conductive patterns) 5 formed between the ceramic substrates 2.

Therefore, the ceramic substrates 2 and the circuits (function patterns) 5 can be formed by the firing, simultaneously. Further, since noble metals such as the silver and the like have low resistivity, it is possible to reduce resistance of the circuits 5.

In this regard, the silver particles (metal particles) present in the ink 10 delivered on the ceramic green sheet 7 are fused and continuously joined to one another, thereby exhibiting conductivity.

The silver colloid particles including the silver particles with an average particle size of about 10 to 30 nm, which is mainly used in the ink for an ink jet method, e.g., silver particles, exhibit conductivity at a temperature of about 200° C.

Therefore, the silver particles present in the ink 10 are fused and continuously joined to one another with ease if they are thermally treated in the temperature range of 600 to 900° C. mentioned above. Thus, the silver particles are transformed into the circuits 5.

By the heat treatment noted above, the circuits 5 are formed to make direct contact with and come into connection with the contacts 6 of the ceramic substrates 2. In a hypothetical case that the circuits 5 are merely placed on the ceramic substrates 2, no mechanical connection strength would be secured between the circuits 5 and the ceramic substrates 2.

Therefore, the circuits 5 may possibly destroyed by shocks or the like. In the present embodiment, however, the circuits 5 are firmly fixed to the ceramic substrates 2 by first softening and then hardening the glass component contained in the ceramic green sheet 7. As a result, the formed circuits 5 can have high mechanical strength.

Using such a heat treatment, the circuit 4 can be formed simultaneously with the circuits 5, thereby producing the ceramic circuit substrate 1.

In the method of producing the ceramic circuit substrate 1 mentioned above, particularly when producing the respective ceramic substrates 2 of which the laminated substrate 3 is formed, the conductive pattern formation ink 10 is delivered to the ceramic green sheet 7.

This ensures that the conductive pattern formation ink 10 can be arranged on the ceramic green sheet 7 in a desired pattern and in a good condition. Therefore, it is possible to form highly accurate function patterns (circuits) 5.

Accordingly, the present invention is capable of not only complying with a need for size reduction of electronic parts as constituent elements of electronic equipments, but also fully coping with a need for production of diversified products in small quantities.

Due to the fact that the heating temperature involved in thermally treating the ceramic green sheet 7 is set above the softening point of the glass component (glass powder) contained in the ceramic green sheet 7, the circuits (function patterns) 5 are tightly fixed to the ceramic substrates 2 (ceramic green sheet 7) by the softened glass component when the ceramic green sheet 7 is transformed into the ceramic substrates 2 through the heat treatment. This makes it possible to increase mechanical strength of the circuits 5.

Thereafter, an anti-cracking agent of the composition as shown in Table 1 was added to the aqueous silver colloid solution, and then ion-exchanged water for adjustment of a content was added to the aqueous silver colloid solution to adjust the content thereof.

By doing so, the conductive pattern formation ink was obtained. Mixing quantities of the components constituting the conductive pattern formation inks of the Examples and the Comparative Example are shown in Table 1.

TABLE 1

| | Content of Silver Colloid Particles [wt %] | Content of Ion-exchanged Water for Adjustment of Concentration [wt %] | Content of 1,3-Propanediol [wt %] | Anti-cracking Agent | | | | | |
|---|---|---|---|---|---|---|---|---|---|
| | | | | Polyethylene Glycol | | Polyglycerin | | Polyglycerin Monooleate | |
| | | | | Content [wt %] | Weight Average Molecular Weight | Content [wt %] | Weight Average Molecular Weight | Content [wt %] | Weight Average Molecular Weight |
| Ex. 1 | 40 | 50 | 5 | 5 | about 600 | — | — | — | — |
| Ex. 2 | 40 | 48 | 5 | 7 | about 600 | — | — | — | — |
| Ex. 3 | 40 | 45 | 5 | 10 | about 600 | — | — | — | — |
| Ex. 4 | 40 | 40 | 5 | 15 | about 600 | — | — | — | — |
| Ex. 5 | 40 | 35 | 5 | 20 | about 600 | — | — | — | — |
| Ex. 6 | 40 | 50 | 5 | — | — | 5 | about 500 | — | — |
| Ex. 7 | 40 | 48 | 5 | — | — | 7 | about 500 | — | — |
| Ex. 8 | 40 | 45 | 5 | — | — | 10 | about 500 | — | — |
| Ex. 9 | 40 | 40 | 5 | — | — | 15 | about 500 | — | — |
| Ex. 10 | 40 | 35 | 5 | — | — | 20 | about 500 | — | — |
| Ex. 11 | 40 | 50 | 5 | 2.5 | about 600 | 2.5 | about 500 | — | — |
| Ex. 12 | 40 | 48 | 5 | — | — | — | — | 7 | about 500 |
| Ex. 13 | 40 | 45 | 5 | — | — | 5 | about 400 | 5 | about 500 |
| Comp. Ex. | 40 | 55 | 5 | — | — | — | — | — | — |

While certain preferred embodiments of the present invention have been described hereinabove, the present invention is not limited thereto. Although a colloid solution is used in the foregoing embodiments as the dispersion solution prepared by dispersing metal particles in a solvent, the dispersion solution may not be the colloid solution.

EXAMPLES

Hereinafter, the present invention will be described in more detail by virtue of examples. However, the present invention is not limited to these examples.

[1] Preparation of Conductive Pattern Formation Ink

Examples 1 to 13 and a Comparative Example

In each of Examples and a Comparative Example, a conductive pattern formation ink was produced as follows.

17 g of trisodium citrate dihydrate and 0.36 g of tannic acid were dissolved in 50 mL of water alkalified by adding an aqueous 10N NaOH solution thereto, to obtain an aqueous solution. 3 mL of a 3.87 mol/L aqueous silver nitrate solution was added to the aqueous solution thus obtained drop by drop.

An aqueous silver colloid solution was obtained by stirring the above aqueous solution for two hours. The aqueous silver colloid solution thus obtained was dialyzed until conductivity thereof is decreased to 30 μS/cm or less, thereby desalting the aqueous silver colloid solution.

At the end of dialysis, coarse silver colloid particles were removed from the aqueous silver colloid solution by performing centrifugal separation at 3000 rpm for 10 minutes. 1,3-propanediol as a drying inhibitor was added to the aqueous silver colloid solution.

[2] Production and Evaluation of Wiring Substrate

First, a ceramic green sheet was prepared in the following manner. Ceramic powder consisting of alumina ($Al_2O_3$) and titanium oxide ($TiO_2$) each having an average particle size of about 1 to 2 μm and glass powder consisting of boron silicate glass having an average particle size of about 1 to 2 μm were mixed with each other in a weight ratio of 1:1.

Polyvinylbutyral as a binder and dibutylphthalate as a plasticizer were added to the ceramic powder and the glass powder to a mixture. Surry was obtained by mixing and stirring the mixture. The slurry thus obtained was coated on a PET film in a sheet shape using a doctor blade, to produce a ceramic green sheet. The ceramic green sheet was cut into a square sheet whose one side has a length of 200 mm.

The conductive pattern formation inks of the Examples 1 to 13 and the Comparative Example were loaded to the ink jet apparatus as shown in FIGS. 4 and 5. Then, the ceramic green sheet was heated to 60° C. and maintained at that temperature.

Liquid droplets having a weight of 15 ng per droplet were sequentially ejected toward the ceramic green sheet from the respective ejection nozzles to draw twenty sets of lines (which will be transformed into metal wirings), each of which has a line width of 50 μm, a thickness of 15 μm and a length of 10.0 cm.

The ceramic green sheet having the lines (pre-patterns) was put into a drying furnace in which the ceramic green sheet was heated, and the lines were dried at 60° C. for 30 minutes. Thereafter, confirmation was made as to whether cracks existed in the respective lines.

The results of confirmation are shown in Table 2. The number of accepted lines having no crack among the twenty sets of lines is indicated in Table 2. The ceramic green sheet on which the lines were formed in the above manner was referred to as a first ceramic green sheet.

Next, forty through-holes each having a diameter of 100 μm were formed by a mechanical punch on another ceramic green sheet in positions corresponding to opposite ends of the lines. Thick film conductive paste which contained silver particles as a conductive component was filled into the through-holes to form contacts (vias).

Using the thick film conductive paste which contained silver particles as a conductive component, square patterns of 2 mm in side length were formed on the contacts (vias) by a screen-printing method to provide terminal portions. The ceramic green sheet on which the terminal portions were formed in the above manner was referred to as a second ceramic green sheet.

Next, a green laminated body was obtained by laminating the first ceramic green sheet below the second ceramic green sheet and then laminating two raw ceramic green sheets therebelow as reinforcing layers. Subsequently, the green laminated body was pressed at a temperature of 100° C. under a pressure of 250 kg/cm$^2$ for 30 seconds.

Thereafter, the green laminated body was fired in the atmosphere, according to a firing profile having a temperature elevation process in which the green laminated body was continuously heated for about six hours at a heating speed of 66° C./hour, for about five hours at a heating speed of 10° C./hour and for about four hours at a heating speed of 85° C./hour, and a temperature constant process in which the green laminated body was maintained for thirty minutes at a maximum temperature of 890° C. By doing so, the lines were transformed in to the metal wirings.

After the laminated body had been cooled, a tester was attached between the terminal portions formed on the twenty sets of the metal wirings to confirm whether cracks existed in the respective metal wirings. The results of confirmation are collectively shown in Table 2.

The number of accepted metal wirings having no crack among the twenty sets of the metal wirings is indicated in Table 2. Also indicated in Table 2 is a conductivity percentage obtained by dividing the number of the accepted metal wirings by the total number of the metal wirings.

TABLE 2

|  | Number of Accepted Lines [number] | Number of Accepted Metal Wiring [number] | conductivity percentage of Metal Wiring [%] |
| --- | --- | --- | --- |
| Ex. 1 | 20 | 9 | 45 |
| Ex. 2 | 20 | 9 | 45 |
| Ex. 3 | 20 | 11 | 55 |
| Ex. 4 | 20 | 10 | 50 |
| Ex. 5 | 20 | 12 | 60 |
| Ex. 6 | 20 | 15 | 75 |
| Ex. 7 | 20 | 19 | 95 |
| Ex. 8 | 20 | 20 | 100 |
| Ex. 9 | 20 | 20 | 100 |
| Ex. 10 | 20 | 20 | 100 |
| Ex. 11 | 20 | 12 | 60 |
| Ex. 12 | 20 | 18 | 90 |
| Ex. 13 | 20 | 19 | 95 |
| Comp. Ex. | 0 | 0 | 0 |

Referring to Table 2, it can be seen that, after drawing and drying the lines, a large number of cracks were generated in the lines produced by the conductive pattern formation ink of the Comparative Example and line shapes themselves were apt to be destroyed. On the other hand, no crack was generated in the lines produced by the conductive pattern formation ink of each of the Examples 1 to 13 and line shapes themselves were not destroyed as compared to the Comparative Example.

Confirmation of cracks in the metal wirings each obtained by firing the lines was performed through a conduction test. As a result, conduction was nearly unavailable in the metal wirings produced by the conductive pattern formation ink of the Comparative Example, whereas conduction was succeeded in a very large number of the metal wirings produced by each of the conductive pattern formation ink of the Examples 1 to 13. This means that metal wirings of extremely high quality were obtained in the present invention.

Causes of conduction defects in the metal wirings of the Comparative Example were confirmed with X-rays. As a result, it is confirmed that the conduction defects were caused by the cracks. It is conceivable that the cracks might be also generated in the firing process.

In addition, the conductivity percentage of the metal wirings produced by the conductive pattern formation ink of each of the Examples 6 to 10, to which the polyglycerin was added, was higher than that of the metal wirings produced by the conductive pattern formation ink of each of the Examples 1 to 5, to which the polyethylene glycol was added.

In the case of the conductive pattern formation ink to which 7 wt % or more of the polyglycerin was added, it was confirmed that little conduction defect was seen and metal wirings having extremely high quality were obtained.

Moreover, the same results as those noted above were attained in the case where the content of the silver colloid particles in the conductive pattern formation ink is changed to 20 wt % and 30 wt %.

What is claimed is:

1. A conductive pattern formation ink for forming a conductive pattern on a base member by patterning, wherein the conductive pattern formation ink is an ink which is used for forming the conductive pattern using a liquid droplet ejecting method, the conductive pattern formation ink comprised of a dispersion solution,
    wherein the dispersion solution comprises a solvent which is an aqueous solution containing water as a major component thereof, metal particles dispersed in the solvent, and a polyglycerin compound consisting of polyglycerin, the polyglycerin compound preventing generation of cracks in the conductive pattern during desolvation of the solvent, and
    wherein a content of the polyglycerin compound in the dispersion solution is in the range of 10 to 20 wt %, and a content of the metal particles in the dispersion solution is in the range of 10 to 45 wt %.

2. The conductive pattern formation ink as claimed in claim 1, wherein a weight average molecular weight of the polyglycerin compound is in the range of 300 to 3000.

3. The conductive pattern formation ink as claimed in claim 1, wherein the base member is a sheet-like ceramic molded body made of a material containing ceramic particles and a binder.

4. The conductive pattern formation ink as claimed in claim 1, wherein a metal constituting the metal particles is at least one kind selected from the group consisting of silver, copper, palladium, platinum and gold.

5. The conductive pattern formation ink as claimed in claim 1, wherein the metal particles comprise metal colloid particles and the dispersion solution comprises a colloid solution.

6. The conductive pattern formation ink as claimed in claim 5, wherein the colloid solution is obtained by preparing an aqueous solution of pH 6 to 10 in which a dispersant and a reducing agent are dissolved, dropping an aqueous metal salt solution into the aqueous solution, and then adjusting the pH of the aqueous solution to 6 through 11, and wherein the dispersant is formed of hydroxy acid or salt thereof having three or more COOH and OH groups in a total number, the number of the COOH groups being equal to or greater than the number of the OH group(s).

7. A conductive pattern formed by the conductive pattern formation ink defined by claim 1.

8. The conductive pattern as claimed in claim 7, wherein the conductive pattern is formed of the metal particles bonded together, the metal particles being bonded to one another on a surface of the conductive pattern without leaving any gap therebetween, and wherein the conductive pattern has specific resistance of less than 20 $\mu\Omega$cm.

9. The conductive pattern as claimed in claim 8, wherein the specific resistance is equal to or less than 15 $\mu\Omega$cm.

10. A wiring substrate provided with the conductive pattern defined by claim 7.

* * * * *